US006298309B1

(12) United States Patent
Benco et al.

(10) Patent No.: US 6,298,309 B1
(45) Date of Patent: Oct. 2, 2001

(54) CURRENT BASED FREQUENCY TRACKING METHOD AND APPARATUS

(75) Inventors: Joseph Benco, Germansville; Ratan Das, Allentown; Cliff Downs, Richboro, all of PA (US)

(73) Assignee: ABB Power T&D Company Inc., Raleigh, NC (US)

( * ) Notice: Subject to any disclaimer, the term of this patent is extended or adjusted under 35 U.S.C. 154(b) by 0 days.

(21) Appl. No.: 09/263,754

(22) Filed: Mar. 5, 1999

(51) Int. Cl.[7] ................................................ G01R 21/06
(52) U.S. Cl. ..................... 702/77; 324/142; 324/76.39; 324/76.11; 324/78; 714/799
(58) Field of Search ..................... 702/75, 77, 60; 324/142, 76.11–78, 76.39; 373/104; 714/799

(56) References Cited

U.S. PATENT DOCUMENTS

| 5,721,689 | * | 2/1998 | Hart .................................. 702/75 |
| 5,736,847 | * | 4/1998 | Van Doorn et al. ................. 324/142 |
| 5,809,045 | * | 9/1998 | Adamiak et al. .................... 714/799 |
| 5,832,413 | * | 11/1998 | Benco ................................ 702/77 |
| 5,832,414 | * | 11/1998 | Hart .................................. 702/77 |
| 6,058,134 | * | 5/2000 | Toivonen ........................... 373/104 |
| 6,185,508 | * | 2/2001 | Van Doorn et al. ................. 702/60 |

* cited by examiner

Primary Examiner—Marc S. Hoff
Assistant Examiner—Khoi Hung Duong
(74) Attorney, Agent, or Firm—Woodcock Washburn Kurtz Mackiewicz & Norris LLP

(57) ABSTRACT

A method for measuring a fundamental frequency of a power system comprises sampling voltage and current waveforms associated with the power system, wherein the voltage and current waveforms are characterized by a fundamental frequency component that may vary over time. Next, determine whether, according to a prescribed frequency tracking criterion, a present value of the fundamental frequency can be measured using voltage samples. If so, measure the fundamental frequency using the voltage samples, and set a best available value ("freq") equal to the measured value based on voltage samples. If the fundamental frequency cannot be measured using the voltage samples, determine whether, according to the prescribed frequency tracking criterion, the present value of the fundamental frequency can be measured using current samples. If so, measure the fundamental frequency using the current samples and set the best available value equal to the measured value based on current samples. If the present value of the fundamental frequency cannot be measured using the voltage or current samples, determine whether previously measured values of the fundamental frequency based on current are stable according to a prescribed stability criterion and, if so, set the best available value to a value based on the previously measured values for a limited period of time.

11 Claims, 2 Drawing Sheets

CURRENT BASED FREQUENCY TRACKING METHOD AND APPARATUS

FIELD OF THE INVENTION

The present invention relates generally to digital protective relaying and metering systems, and more particularly to methods and apparatus for measuring the fundamental frequency of the voltage and current waveforms used by such systems to determine the number of samples per cycle when a fixed rate of sampling is used.

BACKGROUND OF THE INVENTION

Digital protection devices are used in power systems to protect electrical generators and other system components, such as transformers and transmission lines, using voltage and current waveforems. Such digital protection devices may be embodied in a generator protection unit (GPU), protective relay, or the like. For example, a typical GPU estimates voltage and current phasors that are determined from the "fundamental" frequency of the system, which is based upon voltage waveforms, and from such phasors detects various fault conditions that may require a circuit breaker to be tripped. The phasors are also used for metering and other power system control functions. Abnormal conditions may also be detected through relatively large changes in the generator's operating of fundamental frequency. Accordingly, a technique for frequency tracking is important for both deriving accurate voltage and current phasors and for monitoring fault conditions in the generator by detecting a significant change in frequency. Further background information concerning the present invention may be found in U.S. Pat. No. 5,832,413, Nov. 3, 1998, "Generator Protection System and Method for Phasor Estimation and Frequency Tracking During Frequency Ramping," the disclosure of which is hereby incorporated by reference in its entirety.

In typical protection systems of the type discussed above, frequency is calculated using only measured system voltages. There are scenarios, however, in which the voltages are not available and hence the frequency cannot be calculated. This in turn prevents the calculation of many system-wide values needed for protection and metering.

SUMMARY OF THE INVENTION

The present invention makes use of current in addition to voltage to measure or calculate a power system's fundamental frequency. Briefly, in accordance with the present invention, upon detecting the unavailability of voltage (typically three-phase analog voltages), analog current inputs are used to measure the fundamental frequency. In the event that voltage values are not available and the analog currents become unstable, a "history" mechanism may be advantageously employed to maintain a correct frequency for a short period of time.

A presently preferred implementation of a method in accordance with the present invention is used to measure a fundamental frequency of a power system. The inventive method comprises the step of sampling voltage and current waveforms associated with the power system. The next step is to determine whether, according to a prescribed frequency tracking criterion, a present value of the fundamental frequency can be measured using voltage samples and, if so, to measure the fundamental frequency using the voltage samples, and to set a best available value ("freq") equal to the measured value based on voltage samples. If the fundamental frequency cannot be measured using the voltage samples, the next step is to determine whether, according to the prescribed frequency tracking criterion, the present value of the fundamental frequency can be measured using current samples and, if so, to measure the fundamental frequency using the current samples and to set the best available value ("freq") equal to the measured value based on current samples. If the present value of the fundamental frequency cannot be measured using the voltage or current samples, we determine whether previously measured values of the fundamental frequency are stable according to a prescribed stability criterion and, if so, set the best available value ("freq") to a value based on the previously measured values. The best available value of the fundamental frequency is used in subsequent calculations that include performing a Discrete Fourier Transform (DFT) using the best available value for the fundamental frequency.

These and other aspects of the present invention are explained below.

DETAILED DESCRIPTION OF PREFERRED EMBODIMENTS

Figure 1:
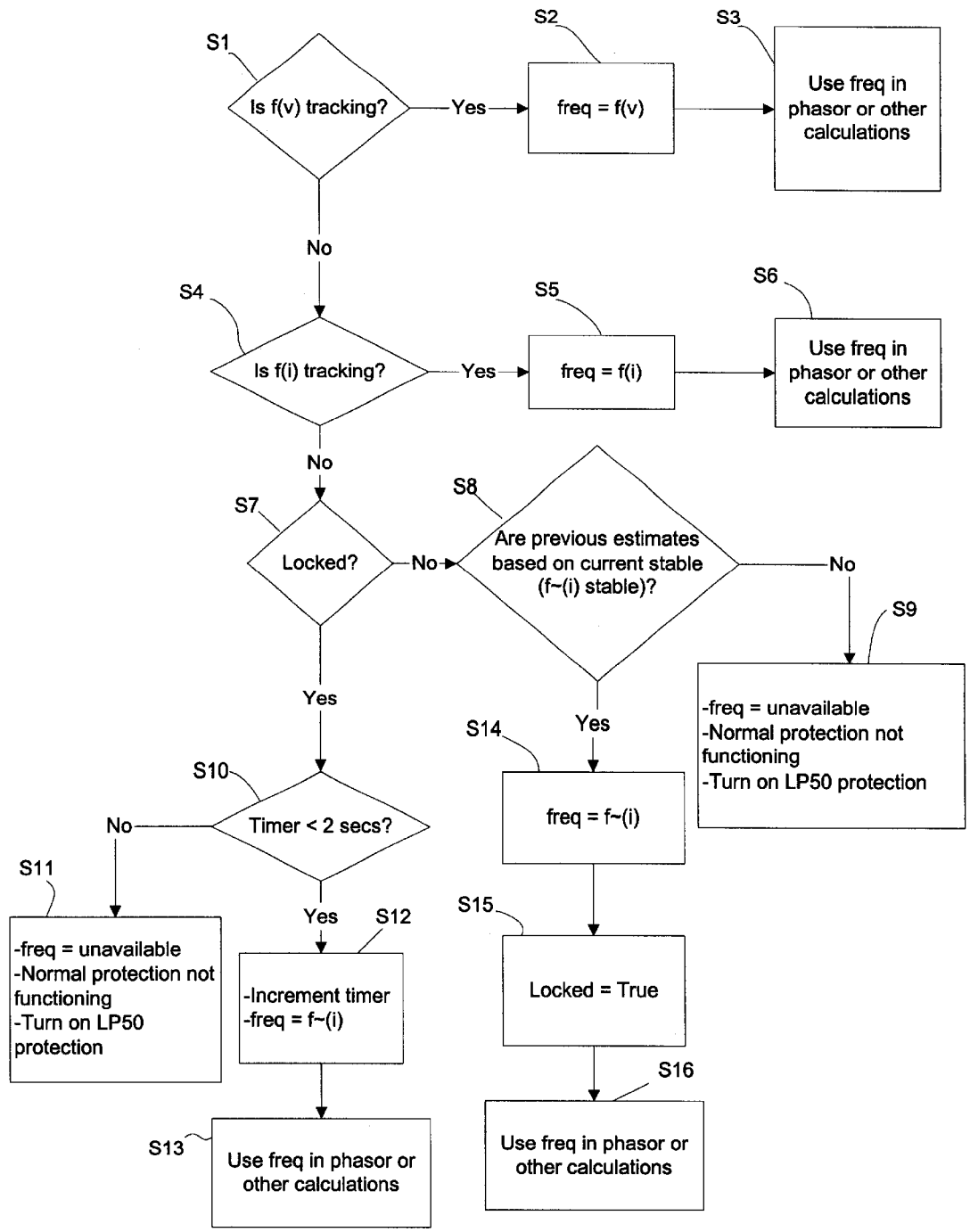
FIG. 1 is a flowchart of a presently preferred method for determining the fundamental frequency of a power system in accordance with the present invention.

As alluded to above, the present invention addresses the following problem: Methods of calculating the fundamental frequency of a power system, or component thereof, based solely on analog system voltage inputs fail to provide any frequency estimate when all voltages in the system are either not present or are below a given threshold. There are several situations that could occur in which the system voltage is not available. Among these are, e.g., (1) the instrument transformer (VT) primary fuses are all blown or (2) there is a close-in three-phase fault. The estimated frequency is used to perform a Discrete Fourier Transform (DFT) on all analog inputs, and therefore it is necessary to know the fundamental frequency at which to perform the DFT. The outputs of the DFT calculations provide most system information used as input to the protection algorithms used within a protective relay. Thus, without a frequency estimate, the protection algorithms cannot be performed, which significantly reduces the functionality of the protective relay.

According to a presently preferred implementation of the present invention, upon detecting that frequency cannot be tracked using available voltage inputs, a current based method is employed. For an energized system, usually both current and voltage are present. If the voltage is not available, then the same algorithm for calculating frequency using voltage is employed using current instead.

In addition, if the voltage is unavailable and the current is able to track frequency but suddenly becomes unstable (due, for example, to a fault in the system), then a "history method" is employed. Frequency estimates are continuously stored so that, if the frequency mate based on current becomes unstable and unusable, protection can continue for a brief period of time until either stable voltage or current waveforms are once again available. If neither becomes available in a short period of time, then protection using the frequency tracking estimates is disabled and an over-current function based on RMS (root mean square) values is employed.

Because the current phasor angles can shift during faults, it is not always desirable to arrive at a frequency estimate based on current. The present invention is used to perform the necessary frequency tracking based on voltage and current using the above-described method.

A synopsis of an algorithm in accordance with the present invention is as follows:

If frequency tracking based on voltage is available, use it (typical case).

Else if frequency tracking based on current is available, use it (next typical case).

If the protection unit cannot track based on current, it may be due to a sudden fault on the line causing a phase shift that disrupts the frequency tracking algorithm. However, it is desirable to continue to protect the system even though a frequency calculation is unavailable. In this case, we reason that if the frequency was stable before frequency tracking was lost, then we can "lock in" on this frequency for a short period of time (e.g., 1 or 2 seconds) and perform all calculations at this frequency. If, after a short period of time, frequency tracking is still not available from either a voltage or current source, then stop performing calculations and default to an RMS current estimation protection method.

An exemplary pseudo-code algorithm to implement this method is as follows:

```
If (f(v) tracking)
    freq=f(v)
    Locked=False
else if (f(i) tracking)
    freq=f(i)
    Locked=False
else if (not Locked)
    if (f~(i) stable)
        freq=f~(i)
        Locked=True
        Timer=0
    else
        freq=unavailable
        all normal protection not functioning
        LF50 protection turns on
else (if Locked)
    if (Timer<2 seconds)
        Increment Timer
        freq=f~(i)
    else
        freq=unavailable
        all normal protection not functioning
        LF50 protection turns on
        Locked=False
``` where the following definitions are used:

| | |
|---|---|
| tracking | The frequency tracking algorithm is able to track based on proper signal levels (e.g., 7 V positive sequence), frequency estimates within a proper range (20 Hz < freq < 87 Hz), and frequency not changing too fast (<90 Hz/sec, <3 Hz/2 cycles). |
| f(v) | Frequency estimate based on voltage. |
| f(i) | Frequency estimate based on current. |
| f~(i) | Previous frequency estimates based on current. |
| stable | Previous two cycles of frequency estimates within +/− 3 Hz (this is coincidentally the same as the "tracking criteria"). Therefore, simply if tracking for two cycles then stable. |
| Locked | The system is using a previous stable value of frequency. |

-continued

| | |
|---|---|
| LF50 | Low Frequency 50 (Overcurrent), RMS based calculation, estimates RMS current values over wide frequency range, independent of frequency. |

A major benefit to this invention is that protection can be performed in a larger number of fault scenarios, thus effectively "filling holes" in prior protection systems.

FIG. 1 is a flowchart of a presently preferred implementation of the invention. As shown, the system first determines whether a frequency estimate based on voltage is tracking (step S1). If so, the system sets the "best available" frequency estimate ("freq") equal to the frequency estimate based on voltage, or freq=f(v), and the Locked flag is set equal to False (step S2). Then, the estimated value, freq, is used in phasor or other calculations as required (step S3).

If in step S1 it is determined that f(v) is not tracking, the system determines whether the frequency estimate based on current is tracking (step S4). If so, freq is set equal to f(i) (step S5) and then this value is used in phasor or other calculations (step S6). In addition, the Locked flag is set equal to False.

As illustrated in the psduedocode illustrated above, the system may use a flag ("Locked") to indicate whether the system is using a previous stable value of frequency. If not, steps S8 and S9 and S14–S16 are performed. If the system is using a previous stable value of frequency, i.e., if Locked is true, steps S10–S13 are performed.

In step S8, the system determines whether previous estimated values of frequency based on current are stable. If not, the estimated frequency (freq) is deemed to be unavailable, and normal protection is deemed to be not functioning. In this case, a low frequency over current RMS based calculation for RMS current values is used for protection. This step is indicated as step S9 of the flowchart. (The RMS process is described in U.S. patent application Ser. No. 09/037,359, filed Mar. 10, 1998, "RMS Overcurrent Backup Function" (invented by Michael Egolf, David G. Hart and James D. Stoupis.)

If in step S8 it is determined that the previous frequency estimates based on current are stable, the estimated frequency, freq, is set equal to a previous frequency estimate based on current (step S14). The Locked flag is then set equal to true and the timer is set to zero (step S15), and then the estimated frequency is employed in phasor or other calculations (step S16).

If in step S7 it is determined that the flag "Locked" is true, the system determines whether a timer is less than a prescribed value, e.g., 2 seconds (step S10). If not, step S11 is performed and "freq" is deemed to be unavailable and normal protection is deemed to be not functioning. In addition, in step S11 the Locked flag is set to False. On the other hand, if the timer is less than 2 seconds, or whatever the prescribed value is, the timer is incremented and "freq" is set equal to the previous frequency estimate based on current (step S12), and then this value is used in phasor or other calculations (step S13).

Figure 2:
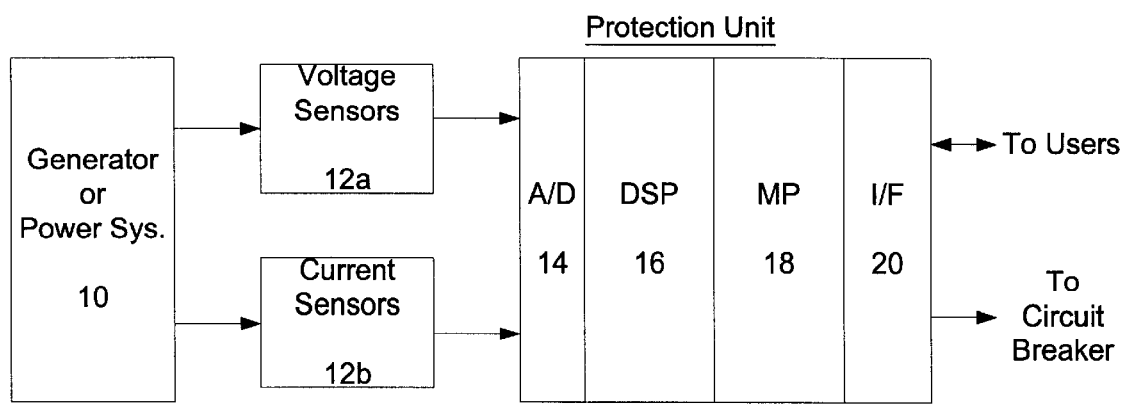
FIG. 2 is a block diagram of a power system employing a protection unit in accordance with the present invention.

FIG. 2 is a block diagram of a power system of the kind in which the present invention may be implemented. As shown, the invention is used in connection with a generator or other power system component 10. Voltage and current sensors 12a and 12b are used to sample voltage and current waveforms associated with the generator/power system 10. A protection unit comprising an analog to digital converter 14, digital signal processor (DSP) 16, microprocessor 18 and interface unit 20 is employed to use the sampled voltage and current values to estimate the fundamental frequency and make phasor and other calculations as described above and in U.S. Pat. Nos. 5,832,413 and 5,721,689.

The scope of protection of the following claims is not intended to be limited to the presently preferred embodiments described above.

We claim:

1. A method for measuring a fundamental frequency of a power system, comprising:
   (a) sampling voltage and current waveforms associated with the power system, wherein the voltage and current waveforms are characterized by a fundamental frequency component that may vary over time;
   (b) determining whether, according to a prescribed frequency tracking criterion, a present value of the fundamental frequency can be measured using voltage samples and, if so, measuring the fundamental frequency using the voltage samples, and setting a best available value ("freq") equal to the measured value based on voltage samples;
   (c) if the fundamental frequency cannot be measured using the voltage samples, determining whether, according to the prescribed frequency tracking criterion, the present value of the fundamental frequency can be measured using current samples and, if so, measuring the fundamental frequency using the current samples and setting the best available value ("freq") equal to the measured value based on current samples; and
   (d) if the present value of the fundamental frequency cannot be measured using the voltage or current samples, determining whether previously measured values of the fundamental frequency are stable according to a prescribed stability criterion and, if so, setting the best available value ("freq") to a value based on the previously measured values.

2. A method as recited in claim 1, further comprising using the best available value of the fundamental frequency in subsequent calculations.

3. A method as recited in claim 2, wherein the subsequent calculations include performing a Discrete Fourier Transform (DFT) using the best available value for the fundamental frequency.

4. A method for measuring a fundamental frequency of a power system, comprising:
   (a) sampling voltage and current waveforms associated with the power system, wherein the voltage and current waveforms are characterized by a fundamental frequency component that may vary over time;
   (b) determining whether, according to a prescribed frequency tracking criterion, a present value of the fundamental frequency can be measured using voltage samples and, if so, measuring the fundamental frequency using the voltage samples, and setting a best available value ("freq") equal to the measured value based on voltage samples;
   (c) if the fundamental frequency cannot be measured using the voltage samples, determining whether, according to the prescribed frequency tracking criterion, the present value of the fundamental frequency can be measured using current samples and, if so, measuring the fundamental frequency using the current samples and setting the best available value ("freq") equal to the measured value based on current samples;
   (d) if the present value of the fundamental frequency cannot be measured using the voltage or current samples, determining whether previously measured values of the fundamental frequency are stable according to a prescribed stability criterion and, if so, setting the best available value ("freq") to a value based on the previously measured values; and
   (e) if it is determined that an acceptable measured value of the fundamental frequency is not presently available, determining that a normal protection scheme cannot be used.

5. A method as recited in claim 1, wherein, in step (d), the previously measured values are used to set the best available value ("freq") for a limited period of time.

6. A method for measuring a fundamental frequency of a power system, comprising:
   (a) sampling voltage and current waveforms associated with the power system, wherein the voltage and current waveforms are characterized by a fundamental frequency component that may vary over time;
   (b) determining whether, according to a prescribed frequency tracking criterion, a present value of the fundamental frequency can be measured using voltage samples and, if so, measuring the fundamental frequency using the voltage samples, and setting a best available value ("freq") equal to the measured value based on voltage samples;
   (c) if the fundamental frequency cannot be measured using the voltage samples, determining whether, according to the prescribed frequency tracking criterion, the present value of the fundamental frequency can be measured using current samples and, if so, measuring the fundamental frequency using the current samples and setting the best available value ("freq") equal to the measured value based on current samples; and
   (d) if the present value of the fundamental frequency cannot be measured using the voltage or current samples, determining whether previously measured values of the fundamental frequency are stable according to a prescribed stability criterion and, if so, setting the best available value ("freq") to a value based on the previously measured values;
   wherein, in step (d), the previously measured values are used to set the best available value ("freq") for a limited period of time, wherein the limited period of time is in the range of about 1 to 2 seconds.

7. A method for measuring a fundamental frequency of a power system, comprising:
   (a) sampling voltage and current waveforms associated with the power system, wherein the voltage and current waveforms are characterized by a fundamental frequency component that may vary over time;
   (b) determining whether, according to a prescribed frequency t racking criterion, a present value of the fundamental frequency can be measured using voltage samples and, if so, measuring the fundamental frequency using the voltage samples, and setting a best available value ("freq") equal to the measured value based on voltage samples;
   (c) if the fundamental frequency cannot be measured using the voltage samples, determining whether, according to the prescribed frequency tracking criterion, the present value of the fundamental frequency can be measured using current samples and, if so, measuring the fundamental frequency using the current samples and setting the best available value ("freq") equal to the measured value based on current samples; and (d) if the present value of the fundamental frequency cannot be measured using the voltage or current samples, determining whether previously measured values of the fundamental frequency are stable according to a prescribed stability criterion and, if so, setting the best available value ("freq") to a value based on the previously measured values;

wherein, in step (d), the previously measured values are used to set the best available value ("freq") for a limited period of time, wherein the limited period of time is in the range of about 1 to 2 seconds, and wherein the prescribed frequency tracking criterion comprises the measured fundamental frequency being within a prescribed frequency range and not changing faster than a prescribed rate.

8. A method as recited in claim 7, wherein the prescribed frequency range is from about 20 Hz to about 87 Hz.

9. A method as recited in claim 7, wherein the prescribed rate is 90 Hz per second in a 60 Hz system.

10. A method as recited in claim 7, wherein the prescribed rate is 3 Hz per 2 cycles of (nominal) system frequency.

11. A method for measuring a fundamental frequency of a power system, comprising:

(a) sampling voltage and current waveforms associated with the power system, wherein the voltage and current waveforms are characterized by a fundamental frequency component that may vary over time;

(b) determining whether, according to a prescribed frequency tracking criterion, a present value of the fundamental frequency can be measured using voltage samples and, if so, measuring the fundamental frequency using the voltage samples, and setting a best available value ("freq") equal to the measured value based on voltage samples;

(c) if the fundamental frequency cannot be measured using the voltage samples, determining whether, according to the prescribed frequency tracking criterion, the present value of the fundamental frequency can be measured using current samples and, if so, measuring the fundamental frequency using the current samples and setting the best available value ("freq") equal to the measured value based on current samples; and (d) if the present value of the fundamental frequency cannot be measured using the voltage or current samples, determining whether previously measured values of the fundamental frequency are stable according to a prescribed stability criterion and, if so, setting the best available value ("freq") to a value based on the previously measured values;

wherein the prescribed stability criterion comprises two cycles of frequency estimates being within a range of +/−3 Hz around a center value.

* * * * *